US008560765B2

(12) United States Patent
Warren

(10) Patent No.: US 8,560,765 B2
(45) Date of Patent: Oct. 15, 2013

(54) SYSTEMS AND METHODS FOR VARIABLE LEVEL USE OF A MULTI-LEVEL FLASH MEMORY

(75) Inventor: Robert W. Warren, Loveland, CO (US)

(73) Assignee: LSI Corporation, San Jose, CA (US)

( * ) Notice: Subject to any disclaimer, the term of this patent is extended or adjusted under 35 U.S.C. 154(b) by 338 days.

(21) Appl. No.: 12/716,259

(22) Filed: Mar. 2, 2010

(65) Prior Publication Data
US 2011/0060861 A1 Mar. 10, 2011

Related U.S. Application Data

(60) Provisional application No. 61/240,481, filed on Sep. 8, 2009.

(51) Int. Cl.
G06F 12/00 (2006.01)
G06F 13/00 (2006.01)

(52) U.S. Cl.
USPC ........... 711/103; 711/133; 711/134; 711/136; 711/160; 711/E12.091; 711/E12.092; 711/E12.098; 711/E12.099

(58) Field of Classification Search
USPC .......... 711/103, 136, 133, 160, 134, E12.091, 711/E12.092, E12.098, E12.099
See application file for complete search history.

(56) References Cited

U.S. PATENT DOCUMENTS 6,338,120 B1 * 1/2002 Hanley ........................... 711/136
7,127,549 B2 10/2006 Sinclair
7,310,699 B2 12/2007 Sinclair
2005/0172067 A1 8/2005 Sinclair
2007/0028040 A1 2/2007 Sinclair
2009/0067303 A1 3/2009 Poo
2009/0172280 A1 7/2009 Trika et al.
2013/0007566 A1 * 1/2013 Shalvi et al. .................. 714/773

FOREIGN PATENT DOCUMENTS

KR 10/2009/0013394 2/2009

OTHER PUBLICATIONS

U.S. Appl. No. 12/473,454, filed May 28, 2009, Dreifus et al.
U.S. Appl. No. 12/691,797, filed Jan. 22, 2010, Warren et al.
U.S. Appl. No. 12/691,819, filed Jan. 22, 2010, Warren et al.
U.S. Appl. No. 12/716,257, filed Mar. 2, 2010, Warren, Robert.
U.S. Appl. No. 12/716,262, filed Mar. 2, 2010, Warren, Robert.
U.S. Appl. No. 12/774,055, filed May 5, 2010, Warren, Robert.
U.S. Appl. No. 12/716,265, filed Mar. 2, 2010, Warren, Robert.
U.S. Appl. No. 12/772,005, filed Apr. 3, 2010, Warren, et al.
U.S. Appl. No. 12/774,065, filed May 5, 2010, Warren, Robert.
U.S. Appl. No. 12/774,077, filed May 5, 2010, Warren, Robert.

* cited by examiner

Primary Examiner — Midys Rojas
(74) Attorney, Agent, or Firm — Hamilton DeSanctis & Cha

(57) ABSTRACT

Various embodiments of the present invention provide systems, methods and circuits for use of a memory system. As one example, an electronics system is disclosed that includes a memory bank, a memory access controller circuit, and an encoding circuit. The memory bank includes a plurality of multi-bit memory cells that each is operable to hold at least two bits. The memory access controller circuit is operable to determine a use frequency of a data set maintained in the memory bank. The encoding circuit is operable to encode the data set to yield an encoded output for writing to the memory bank. The encoding level for the data set is selected based at least in part on the use frequency of the data set.

31 Claims, 4 Drawing Sheets

SYSTEMS AND METHODS FOR VARIABLE LEVEL USE OF A MULTI-LEVEL FLASH MEMORY

CROSS REFERENCE TO RELATED APPLICATIONS

The present application claims priority to (is a non-provisional of) U.S. Pat. App. No. 61/240,481, entitled "Systems and Methods for Variable Level Use of Multi-Level Flash Memory", and filed Sep. 8, 2009 by Warren. The entirety of the aforementioned provisional patent application is incorporated herein by reference for all purposes.

BACKGROUND OF THE INVENTION

The present inventions are related to systems and methods for utilizing multi-bit memory cells, and more particularly to systems and methods for variable life usage of multi-bit memory cells.

Flash memories have been used in a variety of devices where information stored by the device must be maintained even when power is lost to the device. A typical flash memory exhibits a number of cells that can be charged to one of $2^N$ distinct voltage levels representing 'N' bits per cell. For example, a two bit cell may be charged to one of four distinct voltage levels each representing a corresponding two bit pattern (i.e., 00, 01, 10, 11). By allowing each cell to represent more than a single bit, the memory density of a given flash device can be increased dramatically for the cost of a few additional comparators and a reasonable increase in write logic. Currently, there is a trend toward further increasing the number of bits that may be stored in any given cell by increasing the number of distinct voltage levels that may be programmed to the cell. For example, there is a trend toward increasing the number of distinct voltage levels to eight so that each cell can hold three data bits. While the process of increasing the number of bits stored to any given flash memory cell allows for increasing bit densities, it can result in a marked decline in the lifecycle of the flash memory. In some cases, this decline in lifecycle of a memory device is unacceptable.

Hence, for at least the aforementioned reason, there exists a need in the art for advanced systems and methods for implementing memories.

BRIEF SUMMARY OF THE INVENTION

The present inventions are related to systems and methods for utilizing multi-bit memory cells, and more particularly to systems and methods for variable life usage of multi-bit memory cells.

Various embodiments of the present inventions provide electronics systems that include a memory bank, a memory access controller circuit, and an encoding circuit. The memory bank includes a plurality of multi-bit memory cells that each is operable to hold at least two bits. The memory access controller circuit is operable to determine a use frequency of a data set maintained in the memory bank. The encoding circuit is operable to encode the data set to yield an encoded output for writing to the memory bank. The encoding level for the data set is selected based at least in part on the use frequency of the data set. Some instances of the aforementioned embodiments further include a decoding circuit that is operable to reverse the encoding applied by the encoding circuit.

In various instances of the aforementioned embodiments, the data set includes at least two bits. In such instances, the encoding level includes at least a high use level and a low use level, and the encoded output is one of a single two bit output representing the two data bits, or a series of two two bit outputs representing the two data bits. In some cases the encoded output is selected to be the single two bit output representing the two data bits when the use frequency is lower than a threshold corresponding to the low use level. In some such cases, selection of the single two bit output representing the two data bits results in a tradeoff of increased bit density for decreased lifecycle. In other cases the encoded output is selected to be the series of two two bit outputs representing the two data bits when the use frequency is higher than a threshold corresponding to the high use level. In some such cases, selection of the series of two two bit outputs representing the two data bits results in a tradeoff of decreased bit density for increased lifecycle.

In other instances of the aforementioned embodiments, each of the plurality of multi-bit memory cells is operable to hold at least three bits. In such instances, the data set includes at least three data bits, and the encoding circuit is operable to encode the three data bits as the encoded output to the plurality of multi-bit memory cells. The encoded output may be one of: a single three bit output representing the three data bits, or a series of three three bit outputs representing the three data bits.

In various instances of the aforementioned embodiments, determining the use frequency of a data set includes determining the frequency of writes of the data set to the memory bank. In some cases, determining the use frequency of a data set further includes determining the frequency of reads of the data set from the memory bank. In particular instances of the aforementioned embodiments, the plurality of multi-bit memory cells is a plurality of multi-bit flash memory cells. In one or more instances of the aforementioned embodiments, the plurality of multi-bit memory cells is part of a flash memory system communicably coupled to a processor. In some such instances, the processor is further communicably coupled to: an I/O device, and/or a random access memory.

Other embodiments provide methods for varying the lifecycle of a memory cell based upon use frequency. Such methods include: providing a memory device that includes a plurality of multi-bit memory cells with each of the plurality of multi-bit memory cells being operable to hold at least two bits; receiving a data set that includes at least two data bits; determining a use frequency of the data set; selectably encoding the two data bits as two two bit outputs when the use frequency indicates a high use level; and writing the two two bit outputs to two of the plurality of multi-bit memory cells when the use frequency indicates the high use level. In some cases, the methods further include selectably encoding the two data bits as a single two bit output when the use frequency indicates a low use level, and writing the single two bit output to one of the plurality of multi-bit memory cells when the use frequency indicates the low use level.

In various instances of the aforementioned embodiments, the selectably encoding is governed at least in part by comparing the use frequency with a threshold level. In such instances, the high use level is indicated when the use frequency exceeds the threshold level, and the low use level is indicated when the use frequency is less than the threshold level.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
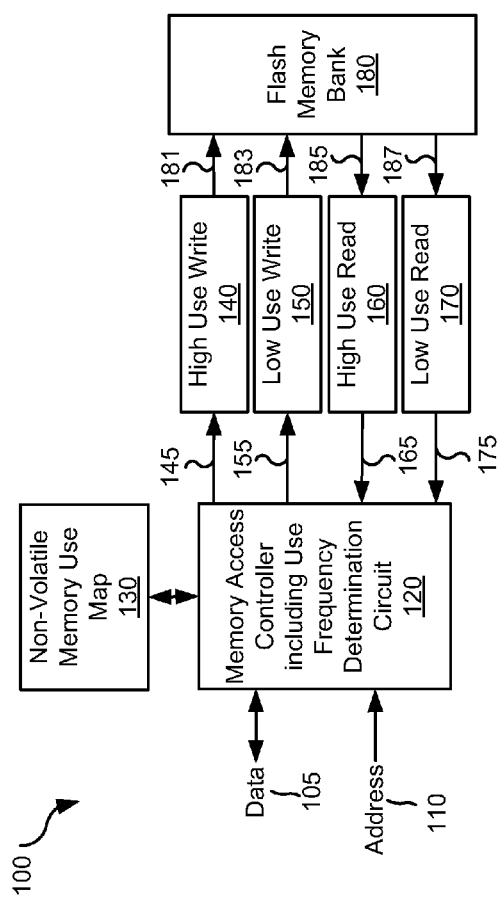
FIG. 1 depicts a flash memory system including a bank of variable life multi-bit flash memory cells in accordance with various embodiments of the present invention.

The present inventions are related to systems and methods for utilizing multi-bit memory cells, and more particularly to systems and methods for variable life usage of multi-bit memory cells.

Some embodiments of the present invention provide for increasing the lifecycle of some cells of a flash memory device where high use writes are expected at the cost of reduced bit density, and for maintaining the higher bit density for data written to other cells of the device. It should be noted that while the various embodiments are described as treating data as two types (high use and low use), they can be extended to treat data of three or more types. For example, a three bit per cell flash memory type may be selected with low use data being written as three bit data, medium use data being written as two-bit data, and high use data being written as single bit data. This approach could be expanded to utilize four bit per cell or higher flash memories.

Following the example above where a two bit flash memory cell is used, the two bit flash memory cell may be variably treated as a single bit flash memory cell or a two bit flash memory cell depending upon whether the data is determined to be high use or low use. By treating the cells as lower density cells, the lifecycle of the particular cell is extended as the differentiation between charge levels may be accentuated by using only outer charge levels that can be distinguished from each other across a longer lifecycle. Using the two bit flash memory cell as an example, there are four charge levels each corresponding to a different two bit pattern. In particular, pattern '11' corresponds to a first charge threshold, pattern '10' corresponds to a second charge threshold, pattern '01' corresponds to a third charge threshold, and pattern '00' corresponds to a fourth charge threshold. The difference between the first charge threshold and the fourth charge threshold is substantially greater than the difference between the first charge threshold and the second charge threshold, or the difference between the third charge threshold and the fourth charge threshold. In the case of low use data, all of the charge thresholds are used leading to an increased memory density with a reduced lifecycle. In the case of high use data, only the first threshold and the fourth threshold are used leading to a decreased memory density with an increased lifecycle. Again, it should be noted that while a two bit cell is used as an example, the approach may be extended to higher density memory cells including, but not limited to, three bit memory cells and four bit memory cells.

In some cases, one or more embodiments of the present invention can be implemented without modifying commercially available flash memory devices. Thus, a higher bit density reduced lifecycle device can be modified for use as a lower bit density increased lifecycle device by encoding data written to the flash memory and decoding data received from the flash memory. In some cases, such an approach allows for varying design requirements that can be implemented using only one or a limited number of flash memory types. This results in economies of scale and reduced cost per bit of flash memory.

Turning to FIG. 1, a flash memory system 100 including a flash memory bank 180 with a plurality of variable life multi-bit flash memory cells is shown in accordance with various embodiments of the present invention. Flash memory system 100 includes a memory access controller circuit 120 that receives an address input 110 that selects which location data will be read from or written to, and a bidirectional data I/O 105 that receives data to be written and provides data that has been read. Memory access controller circuit 120 includes a use frequency determination circuit that is operable to determine a use frequency value associated with different data sets maintained in flash memory bank 180. In some embodiments of the present invention, the aforementioned use frequency value is calculated in accordance with the following equation:

$$\text{Use Frequency Value} = \eta \text{Writes} + \alpha \text{Reads},$$

where Writes indicates the number of writes of the data set within a defined time period, Reads indicates the number of reads of the data set, and $\eta$ and $\alpha$ are scaling factors. The value of Reads and Writes is maintained in a non-volatile memory use map 130. Where read accesses have a less detrimental impact on the lifecycle of the memory that write accesses, $\eta$ may be much larger than $\alpha$. In some embodiments, $\alpha$ is zero and $\eta$ is one. The use frequency value is compared by memory access controller circuit 120 to one or more thresholds to make a determination of whether the data access should be treated as a low use access, a high use access, or some other intermediate use access. It should be noted that other approaches may be used for determining the difference between high use data, low use data, and/or intermediate use data in accordance with different embodiments of the present invention.

Where it is the first time a particular data set is written to flash memory bank 180, an initial number of writes and/or reads associated with the data sets is written to non-volatile memory use map 130 in relation to a signature of the data set. The signature of the data set may be any identifier known in the art that is capable of identifying a data set maintained in flash memory bank 180. The initial number of writes and/or reads provides an ability to control the initial level that a data set is encoded and written to the memory. In the non-volatile memory the number of reads and/or writes within a defined period of time of the data set are written in relation to the signature. Thus, after the data set is initially written to the memory, the signature and writes and/or reads associated therewith are stored in the non-volatile memory. As an example, the signature may be the starting address identified by address input 110 where the data set is written to and read. Where the data set is deleted, the signature for the data set is removed from non-volatile memory use map 130. Based upon the disclosure provided herein, one of ordinary skill in the art will recognize a variety of signatures that may be used to identify data sets. It should be noted that non-volatile memory use map 130 may be implemented using a volatile memory that is used to maintain updates to the various information during operation of the memory system, and that is written back to a non-volatile memory when the power to the memory system is interrupted. Based upon the disclosure provided herein, one of ordinary skill in the art will recognize a variety of implementations of non-volatile memory use map 130 that may be used in relation to different embodiments.

As an example, where flash memory bank 180 offers two level encoding that is to be applied to the data when data is written. Where the data is determined to be high use data, the data may be written as a single bit of data per two bit cell. In contrast, where the data is determined to be low use data, the data may be written as two bits of data per two bit cell. It should be noted that cells offering encoding of three or more bits per cell may be used where only two encoding levels are used (high use and low use), or three or more encoding levels are used (high use, low use, and one or more intermediate use levels). It should be noted that in some embodiments the determination of whether to encode as one bit, two bit or three bit data per cell may be made based upon criteria in addition to that derived from the determined use frequency value.

An output 145 from memory access controller circuit 120 is provided to a high use write circuit 140, and an output 155 from memory access controller circuit 120 is provided to a low use write circuit 150. Output 145 includes the data to be written as received via bidirectional data I/O 105 along with an indication that high use encoding is to be used, and output 155 includes the data to be written as received via bidirectional data I/O 105 along with an indication that low use encoding is to be used. High use write circuit 140 performs high use write encoding and provides the encoded data as an output 181, and low use write circuit 150 performs low use write encoding and provides the encoded data as an output 183. Using the example where the cells of flash memory bank 180 are each capable of holding two bits of data, the following table identifies the threshold levels used when high use encoding (e.g., in this case single bit encoding) or when low use encoding (e.g., in this case two bit encoding) two bit encoding for cells is used. The threshold to the right represents the value written to the cell, and the threshold to the left represents the value of the data bits in the cell.

| Low Use Encoding | High Use Encoding |
|---|---|
| '00' => '00' | '0' => '00' |
| '01' => '01' | |
| '10' => '10' | '1' => '11' |
| '11' => '11' | |

Thus, where a low use encoding is determined, the data received as part of output 155 is provided as is to output 183. In contrast, where high use encoding is determined, a '0' data input received as part of output 155 is converted to a '00' write to flash memory bank 180 via output 181; a '1' data input received as part of output 155 is converted to a '11' write to flash memory bank 180 via output 183. It should be noted that while only one and two bit encoding are described herein, that three bit or higher encoding can be used. Other encoding examples that may be used are discussed in U.S. patent application Ser. No. 12/691,819 entitled "Systems and Methods for Extended Life Multi-Bit Memory Cells" and filed Jan. 22, 2010 by Warren et al. The entirety of the aforementioned application is incorporated herein by reference for all purposes.

To demonstrate application of the above mentioned encoding, the following table identifies the encoding applied to respective data inputs for a six bit data input where three bit encoding, two bit encoding or one bit encoding is determined for cells of flash memory bank 180:

| Data Input | Low Use Encoding | High Use Encoding |
|---|---|---|
| '00' | Output 183 is '00' | Output 181 is '00', '00' |
| '01' | Output 183 is '01' | Output 181 is '00', '11' . . . |
| '10' | Output 183 is '10' | Output 181 is '11', '00' |
| '11' | Output 183 is '11' | Output 181 is '11', '11' |

When the data is read from flash memory bank 180, the encoding that was applied during the write is reversed by a high use read circuit 160 or a low use read circuit 170. In particular, where the data to be read was originally written by high use write circuit 140, high use read circuit 160 receives an output 185, applies the high use decoding, and provides a decoded output 165 to memory access controller circuit 120. Where the data to be read was originally written by low use write circuit 150, low use read circuit 170 receive an output 187, applies the low use decoding, and provides a decoded output 175 to memory access controller circuit 120. Using the example where the cells of flash memory bank 180 are each capable of holding two bits of data, the following table identifies the threshold levels used when high use encoding or low use encoding was originally applied to the data written to a given cell of flash memory bank 180:

| High Use Encoding | | Low Use Encoding | |
|---|---|---|---|
| Output 185 | Output 165 | Output 187 | Output 175 |
| '00' => '0' | | '00' => '00' | |
| '01' => '0' | | '01' => '00' | |
| '10' => '1' | | '10' => '01' | |
| '11' => '1' | | '11' => '01' | |

Thus, where a low use encoding was used to write the particular cells being read back, the data received from flash memory bank 180 as output 185 is provided as is as a decoded output 175. Where high use encoding was used to write the particular cells being read back, any of a '00' or '01' are converted to a '0' that is provided via decoded output 165; any of a '10' or '11' are converted to a '1' that is provided via decoded output 175. One of decoded output 165 or decoded output 175 is provided by memory access controller circuit 120 as data via bidirectional data I/O 105.

It should be noted that other encodings may be used depending upon the particular implementation. For example, a two bit per cell device may be encoded as two bits per cell or one bit per cell. In such a case, where one bit encoding is applied a two bit value of '00' may correspond to a single bit '0', and all of two bit values '01', '10', and '11' may correspond to a single bit '1'. Based upon the disclosure provided herein, one of ordinary skill in the art will recognize a variety of encodings that may be applied to a given multi-bit memory cell.

Figure 2:
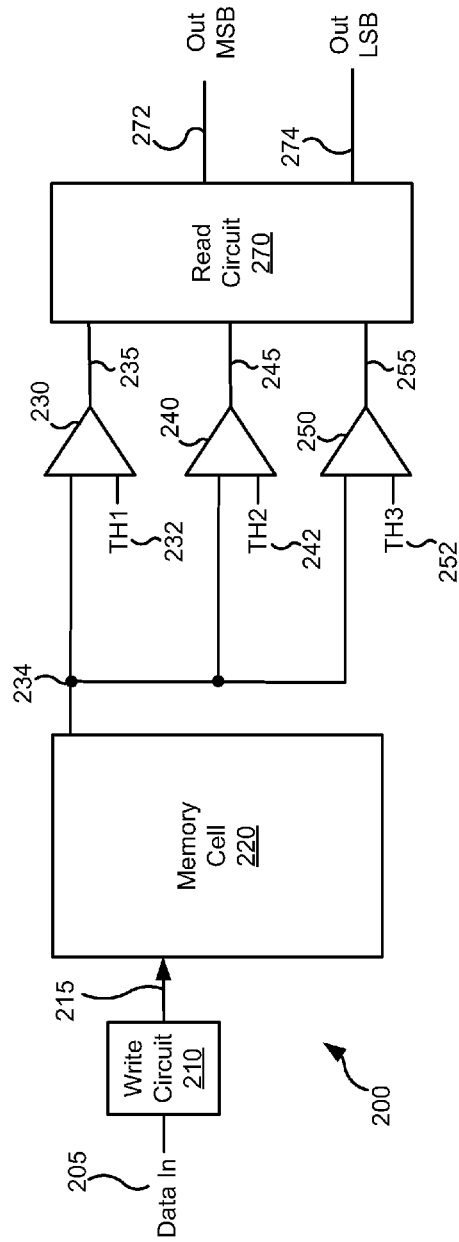
FIG. 2 shows a detailed implementation of a two bit flash memory cell that may be used in relation to the flash memory system of FIG. 1.

Turning to FIG. 2, a detailed implementation of a two bit flash memory cell 200 that may be used in relation to the flash memory system of FIG. 1 is shown. Two bit flash memory cell 200 includes $2^n-1$ comparators (i.e., comparators 230, 240, 250) where 'n' is the number of bits per cell. Two bit flash memory cell 200 includes a write circuit 210 that receives a data input 205. Data input 205 is a two bit data input with possible values of '00', '01', '10' and '11'. Write circuit 210 buffers data input 205 and directs a voltage threshold 215 representing data input 205 to memory cell 220. Voltage threshold 215 has four discrete values corresponding to the four possible two bit values that can be stored in memory cell 220. For example, where data input 205 is a '00', voltage threshold 215 is a $V_L$; where data input 205 is a '11', voltage threshold 215 is a $V_H$, where data input 205 is a '10', voltage threshold 215 is a $V_H-V_S$; and where data input 205 is a '01', voltage threshold 215 is a $V_H-2V_S$. In an exemplary case, $V_H-2V_S$ is greater than $V_L$.

When memory cell 220 is to be read, an output voltage threshold 234 is provided in parallel to three comparators 230, 240, 250. Where memory cell 220 is not faulty, output voltage threshold 234 is approximately equal to voltage threshold 215. Where, on the other hand, memory cell 220 has been written and/or read a large number of times, damage resulting in significant leakage may result. In such a case, output voltage threshold 234 may be substantially less than voltage threshold 215. Comparator 230 compares output voltage threshold 234 with a threshold value 232; comparator 240 compares output voltage threshold 234 with a threshold value 242; and comparator 250 compares output voltage threshold 234 with a threshold value 252. The comparisons result in a thermometer output composed of comparator outputs 235, 245, 255. Using the example above, threshold value 232 may be $(V_L+V_H-2V_S)/2$ (i.e., the average of the two threshold values), threshold value 242 may be $(2V_H-3V_S)/2$ (i.e., the average of the two threshold values), and threshold value 252 may be $(2V_H-V_S)/2$ (i.e., the average of the two threshold values). Where output voltage threshold 234 is less than threshold value 232, comparator output 235 is a logic '0', comparator output 245 is a logic '0', and comparator output 255 is a logic '0' resulting in a thermometer output of '000'. This thermometer output is provided to a read circuit 270 that converts the thermometer output into a two bit output with a MSB 272 of a logic '0' and an LSB 274 of a logic '0'. Alternatively, where output voltage threshold 234 is greater than threshold value 232 and less than threshold value 242, comparator output 235 is a logic '1', comparator output 245 is a logic '0', and comparator output 255 is a logic '0' resulting in a thermometer output of '001'. This thermometer output is provided to a read circuit 270 that converts the thermometer output into a two bit output with a MSB 272 of a logic '0' and an LSB 274 of a logic '1'. Alternatively, where output voltage threshold 234 is greater than threshold value 242 and less than threshold value 252, comparator output 235 is a logic '1', comparator output 245 is a logic '1', and comparator output 255 is a logic '0' resulting in a thermometer output of '011'. This thermometer output is provided to a read circuit 270 that converts the thermometer output into a two bit output with a MSB 272 of a logic '1' and an LSB 274 of a logic '0'. Finally, where output voltage threshold 234 is greater than threshold value 252, comparator output 235 is a logic '1', comparator output 245 is a logic '1', and comparator output 255 is a logic '1' resulting in a thermometer output of '111'. This thermometer output is provided to a read circuit 270 that converts the thermometer output into a two bit output with a MSB 272 of a logic '1' and an LSB 274 of a logic '1'.

It should be noted that two bit flash memory cell 200 can be scaled to larger numbers of bits per cell by increasing the number of comparators used to detect intermediate voltage levels, and by modifying write circuit 210 to make it capable of writing the increased number of thresholds. For example, a three bit memory cell may be created using the same memory cell along with seven comparators (i.e., $2^n-1$ comparators) and a write circuit capable of writing eight threshold values corresponding respectively to '000', '001', '010', '011', '100', '101', '110', and '111'. Similarly, cells capable of holding larger number of bits may be designed by increasing the number of comparators and writable threshold values. The encoding/decoding processes discussed above may be applied to any memory cell capable of holding two or more bits per cell.

Figure 3:
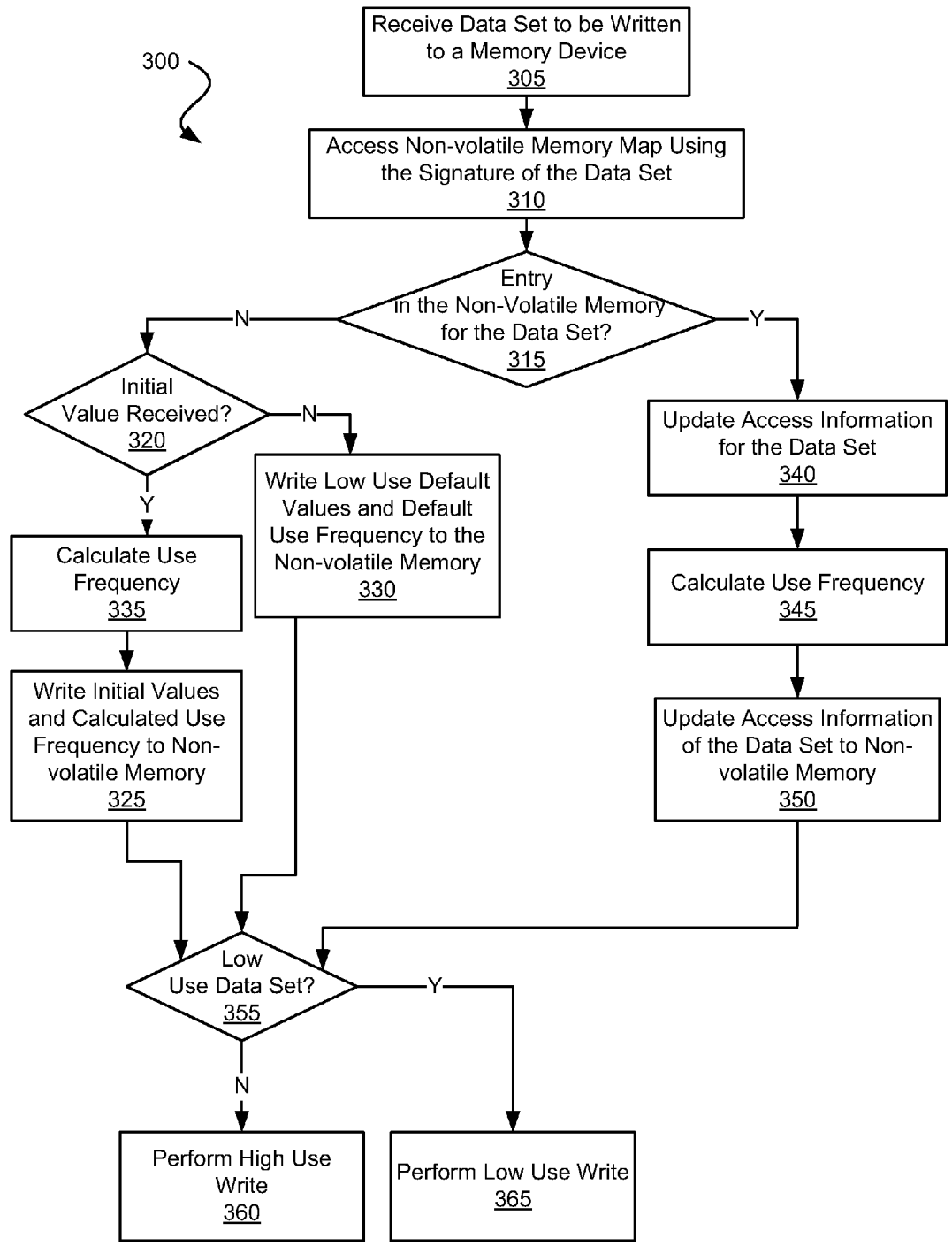
FIG. 3 is a flow diagram of a method in accordance with some embodiments of the present invention for writing data to a variable life, two bit flash memory device.

Turning to FIG. 3, a flow diagram 300 of a method for writing data to a variable life, two bit flash memory device is shown in accordance with some embodiments. Following flow diagram 300, a data set is received that is to be written to a memory device (block 305). The data set is a series of digital bits each exhibiting either a logic '1' or a logic '0'. The size of the data set depends on the amount of data to be written to the memory device, and/or the size of any front end write buffering employed by the memory device. In some embodiments, the memory device is a flash memory device capable of storing three bits per memory cell through use of seven threshold comparisons. In other embodiments, the memory device is another type of solid state memory capable of storing three bits per memory cell through use of seven threshold comparisons. Based upon the disclosure provided herein, one of ordinary skill in the art will recognize a variety of memory devices to which the different embodiments disclosed herein may be applied. In particular, it should be noted that a similar method may be applied to a memory device capable of storing two bits per memory cell through use of three threshold comparisons, or more than three bits per memory cell through use of $2^n-1$ comparisons, where n is the number of bits per cell.

Upon receiving a data set (block 305), a non-volatile memory use map is accessed (block 310) and it is determined if a signature of the data set is maintained in the non-volatile memory map (block 315). Where it is the first time a particular data set is written to the memory, there will not be a signature for the data set in the non-volatile memory use map. Alternatively, where it is not the first time that the data set has been written to the memory, there will be a signature for the data set along with a number of reads and/or writes of the data set that have occurred over a particular time period. Again, the signature of the data set may be any identifier known in the use that is capable of identifying a data set maintained in the memory. In one particular embodiment, the signature is the starting address identified by an address to which the data set is to be written in the memory. Based upon the disclosure provided herein, one of ordinary skill in the art will recognize a variety of signatures that may be used to identify data sets.

Where it is determined that the data set was not previously written to the memory (block 315), it is determined if an initial value was received for the data set (block 320). Such an initial value may be used to set a level sufficiently low to guarantee that the data set is treated as low use data, or sufficiently high to guarantee that the data set is treated as high use data. The initial value may include, for example, an initial number of writes and/or reads. Where an initial value is received (block 320), the number of writes and/or reads corresponding to the initial value is used to calculate a use frequency value for the data set (block 335). The use frequency value may be calculated in accordance with the following equation:

$$\text{Use Frequency Value} = \eta/\text{Writes} + \alpha\text{Reads},$$

where Writes indicates the number of writes of the data set within a defined time period, Reads indicates the number of reads of the data set, and η and α are scaling factors. The value of Reads and Writes is provided as part of the initial value. The calculated use frequency value and the initial value are written to the non-volatile memory map in relation to the signature of the data set (block 325). Alternatively, where an initial value is not received (block 320), information for the data set is written to the non-volatile memory in relation to the data set such that a low use will be selected for the processing the data set (block 330). This may include, for example, indicating the occurrence of a single write of the data set in relation to the signature of the data set that is maintained in the non-volatile memory use map. A default use frequency value is made available for later threshold comparison.

Alternatively, where the signature of the data set is already in the non-volatile memory use map (block 315), the information (e.g., number of writes and/or reads over a defined period) pulled from the non-volatile memory is updated to reflect the additional data write (block 340). This updated data is used to calculate a use frequency value using the same approach discussed in relation to block 335 (block 345). The updated write and/or read data is stored back to the non-volatile memory along with the calculated use frequency value (block 350).

The calculated use frequency value is compared with a threshold to determine whether the data set is to be treated as high use data or low use data (block 355). Where the use frequency value is greater than the threshold, the data is treated as high use data. In contrast, where the use frequency value is less than the threshold, the data is treated as low use data. Where the data set is to be treated as low use data (block 355), a low use data write is performed (block 365). A low use data write includes writing each two bit cell of the memory with two bits of data, thus increasing the memory density at the expense of reduced lifecycle. The reduction in lifecycle is mitigated by the relatively limited number of accesses to the data set (i.e., the data set is identified as low use data). Alternatively, where the data set is to be treated as high use data (block 355), a high use data write is performed (block 360). A high use data write includes writing each two bit cell of the memory with a single bit of data, thus decreasing the memory density with the advantage of increased lifecycle. The increase in lifecycle used to compensate for the relatively large number of accesses to the data set (i.e., the data set is identified as high use data).

Again, it should be noted that the method may be expanded to facilitate three or more use levels where three or more bits may be stored to each cell of the memory. Use of such additional levels may include comparing the use frequency value with additional thresholds indicating interim use levels in additional to the previously mentioned high and low use levels. Such additional use levels may be implemented by writing data to the memory in an interim level representing yet another tradeoff between lifecycle and memory density. Examples of other encoding schemes offering such interim levels are described in U.S. patent application Ser. No. 12/691,819 entitled "Systems and Methods for Extended Life Multi-Bit Memory Cells" and filed Jan. 22, 2010 by Warren et al. The aforementioned reference was previously incorporated herein by reference for all purposes.

Figure 4:
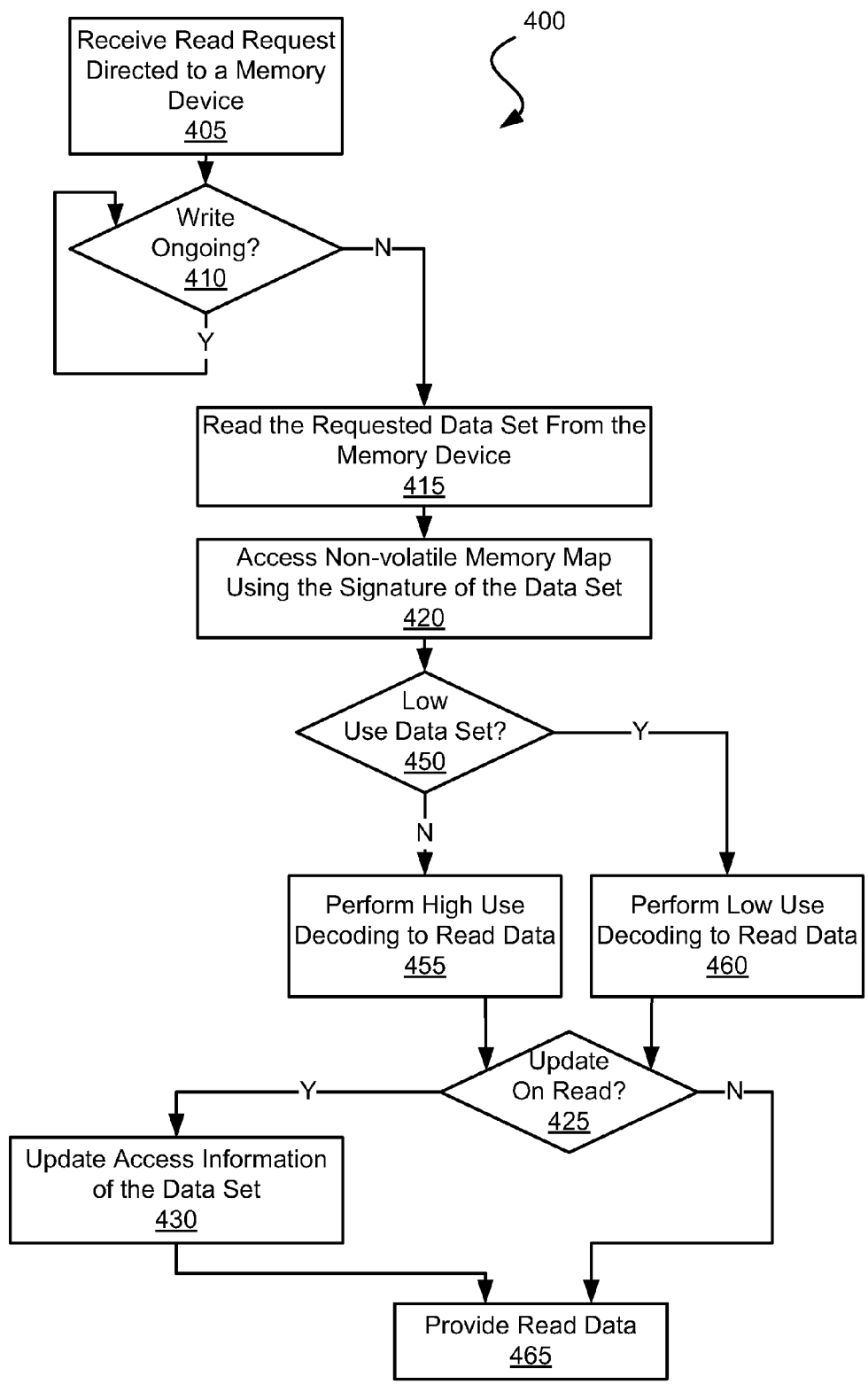
FIG. 4 is a flow diagram of a method in accordance with some embodiments of the present invention for reading data from a variable life, two bit flash memory device.

Turning to FIG. 4, a flow diagram 400 depicting a method in accordance with some embodiments of the present invention for reading data from a variable life, two bit flash memory device is shown. Again, it should be noted that the method in flow diagram 400 may be expanded to utilize additional use levels. Following flow diagram 400, a request to read data is directed to a memory device (block 405). The request may include, for example, an address of data that is to be retrieved from the memory device. It is determined whether a write to the memory device is currently ongoing (block 410). Where a write is currently ongoing (block 410), completion of the write is awaited. If either a write was not ongoing or a previously ongoing write has completed (block 410), the requested data set is read from the memory device (block 415). The read data includes detecting a voltage threshold for each memory cell read and converting the magnitude of the voltage threshold into a three bit pattern. This process is repeated across a number of memory cells resulting in a series of three bit patterns.

In addition, to the read access to the memory, the non-volatile memory use map is accessed using the signature associated with the data set to be read (block 420). The non-volatile memory access returns the use frequency value that can be used to determine whether the data associated with the read access was originally written as high use data or low use data. Using this information, it is determined whether the data read from the memory was originally written as high use data or low use data (block 450). Where the data was originally written as low use data (block 450), a low use decoding is applied to the read data (block 460). This includes writing each two bits of data received from each memory cell as two bits of output data. In contrast, where the data was originally written as high use data (block 450), a high use decoding is applied to the read data (block 455). This includes writing each two bits of data received from each memory cell as a single output bit (e.g., '00' results in a '0' output, and any of the other combinations results in a '1' output).

It is determined whether an updates are performed to the non-volatile memory use map on read accesses (block 425). In some cases, the degradation to the memory due to read accesses is minimal compared with write accesses. In such cases, the Reads parameter associated with the signature may not be updated as it represents only a marginal change in the use frequency value (e.g., the value of α is very small when compared with the value of η). Where an update on a read access is called desired (block 425), the access information associated with the data set (e.g., Writes and Reads) to be read is updated (block 430). This may include incrementing the value of Reads to reflect the additional read and is written back to the non-volatile memory use map. The decoded data provided through either low use decoding or high use decoding is then provided as the read data (block 465)

Figure 5:
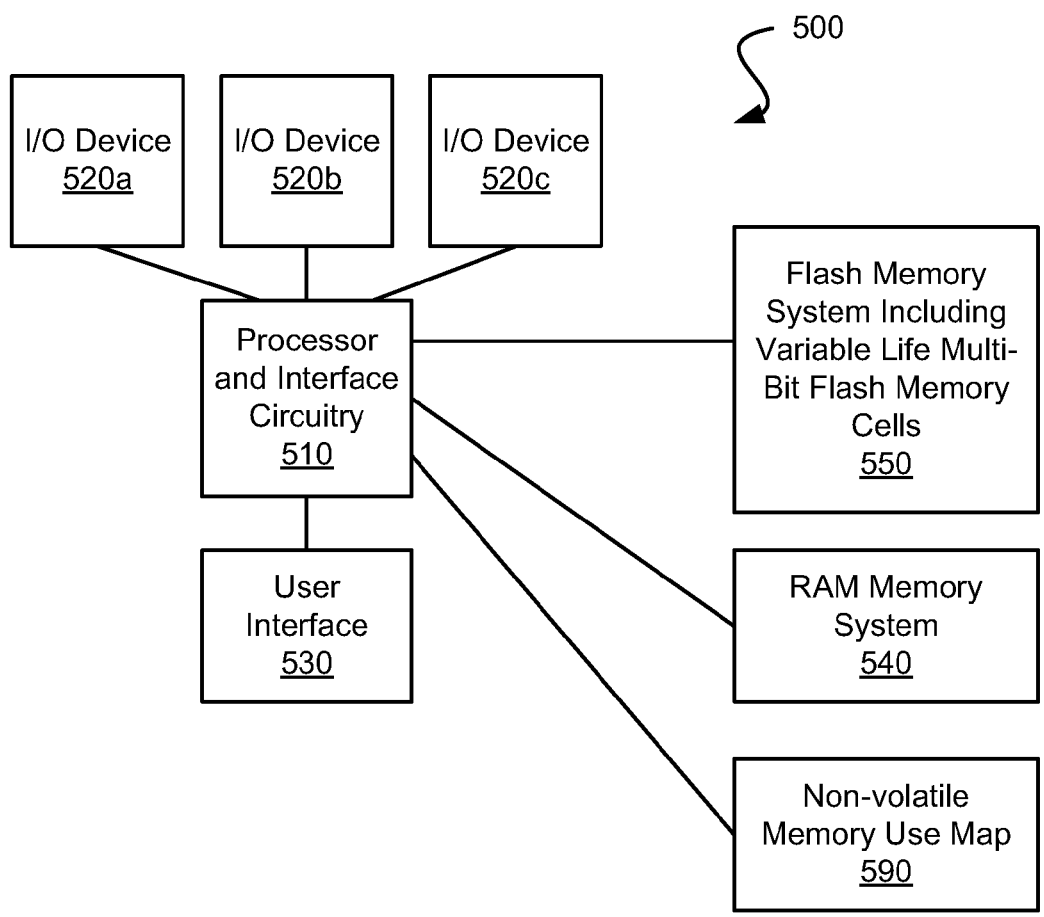
FIG. 5 shows an electronic system including a flash memory system with variable life multi-bit flash memory cells in accordance with one or more embodiments of the present invention.

Turning to FIG. 5, an electronic system 500 including a flash memory system 550 with variable life multi-bit flash memory cells is shown in accordance with one or more embodiments of the present invention. In addition to flash memory system 550, electronic system 500 includes a processor with interface circuitry 510 that is communicably coupled to one or more I/O devices 520 and a user interface 530. In addition, processor 510 is communicably coupled to a non-flash random access memory 540 and a non-volatile memory use map 590. In one particular implementation, electronic system 500 is a personal computer where I/O devices 520 may include, but are not limited to, a keyboard, a mouse, a touch screen or the like. In such a case, user interface 530 may be a display. Random access memory 540 may hold a variety of instructions that are executable by processor 510 to cause particular actions to take place. Non-volatile memory use map 590 maintains a map of data sets stored in flash memory system 550 along with an indication of use of each of those data sets. It should be noted that non-volatile memory use map 590 may be implemented purely using a non-volatile memory, but also may be implemented using a volatile memory that is used to maintain updates to the various information during operation of the memory system, and that is written back to a non-volatile memory when the power to the memory system is interrupted. Based upon the disclosure provided herein, one of ordinary skill in the art will recognize a variety of implementations of non-volatile memory use map 130 that may be used in relation to different embodiments.

Flash memory system 550 may be implemented to include the ability to encode data stored in the memory such that fewer thresholds must be distinguished. As such, the memory density may be reduced in exchange for increasing the lifecycle of the memory or a portion thereof. In some cases, flash memory system 550 may be replaced by flash memory system 100 discussed above in relation to FIG. 1, and may include a number of memory cells similar to that discussed above in relation to FIG. 2. Of note, flash memory system 550 may be implemented using memory devices that are operable to hold two or more bits per cell, with the encoding/decoding process being used to tradeoff between the number of bits per cell and the life expectancy of the device or region of the device. In some cases, accesses to flash memory system 550 may be done consistent with the approaches discussed above in relation to FIG. 3 and FIG. 4.

Based upon the disclosure provided herein, one of ordinary skill in the art will recognize that different embodiments of the present invention can be implemented without modifying commercially available memory devices including, but not limited to, flash memory devices. Thus, where a higher bit density reduced lifecycle device can be modified for use as a lower bit density increased lifecycle device by encoding data written to the memory device and decoding data received from the memory device. Such an approach advantageously allows for varying design requirements that can be implemented using only one or a limited number of flash memory types. The aforementioned approach results in economies of scale and reduced cost per bit of a given memory device. Of note, the processes of encoding data provided to memory cells in accordance with different embodiments of the present invention can be replicated for devices offering larger numbers of bits per cell. For example, a device having cells that are designed to hold three bits per cell can be written either as one bit per cell, where maximum lifetime is required, two-bit cells or three bit cells depending upon the desired lifecycle. The same approach for encoding and decoding information can be used to exchange bit density for increased lifecycle. The different embodiments disclosed herein may also be extended to include using multiple cells for a single bit of information where the reliability of the data is the highest priority. Similar to mirroring two Storages devices for redundancy, this method, while lowering the density of the device, increases the reliability.

It has been determined that the lifecycle of a given multi-level flash memory device can be increased with only a moderate reduction in bit density where some cells are written using a lower density write approach and other cells are written using higher density write approaches. Various embodiments of the present invention balance the density of memory cells based upon frequency of access to data maintained in the memory. Data that demonstrates that it is accessed at a high frequency is written to lower density memory cells that offer the greatest lifecycle at the expense of reduced data density (i.e., reduced number of effective bits per cell), while data that is demonstrated to be accessed relatively infrequently is written to higher density memory cells that offer greater data density (i.e., increased number of effective bits per cell) as the expense of decreased lifecycle. As such, the rate at which any cell in the memory ages may be more closely related to the rate of aging of other cells.

In conclusion, the invention provides novel systems, devices, methods and arrangements for use of a memory system. While detailed descriptions of one or more embodiments of the invention have been given above, various alternatives, modifications, and equivalents will be apparent to those skilled in the art without varying from the spirit of the invention. For example, systems may be developed that do not maintain data set access frequency information in a non-volatile memory, but receive messages from a host indicating the access frequency of the data and/or indicating that the data should be maintained as high use data, low use data, or some intermediate use level. This use level indication from a host may then be implemented by applying the corresponding encoding in the memory system. Based upon the disclosure provided herein, one of ordinary skill in the art will recognize other implementations. Therefore, the above description should not be taken as limiting the scope of the invention, which is defined by the appended claims.

What is claimed is:

1. An electronic system, the system comprising:
a memory bank including a plurality of multi-bit memory cells, wherein each of the plurality of multi-bit memory cells is operable to hold at least two bits;
a memory access controller circuit, wherein the memory access controller circuit is operable to determine a use frequency of a data set maintained in the memory bank; and
an encoding circuit, wherein the encoding circuit is operable to encode the data set to yield an encoded output for writing to the memory bank, wherein an encoding level is operable to control a number of bits to be stored in the multi-bit memory cells, and wherein the encoding level for is selected based at least in part on the use frequency of the data set.

2. The electronic system of claim 1, wherein the electronic system further comprises:
a decoding circuit, wherein the decoding circuit is operable to reverse the encoding applied by the encoding circuit.

3. The electronic system of claim 1, wherein the data set includes at least two bits, wherein the encoding level includes at least a high use level and a low use level, and wherein the encoded output is selected from a group consisting of: a single two bit output representing the two data bits, and a series of two two bit outputs representing the two data bits.

4. The electronic system of claim 3, wherein the encoded output is selected to be the single two bit output representing the two data bits when the use frequency is lower than a threshold corresponding to the low use level.

5. The electronic system of claim 4, wherein selection of the single two bit output representing the two data bits results in a tradeoff of increased bit density for decreased lifecycle.

6. The electronic system of claim 3, wherein the encoded output is selected to be the series of two two bit outputs representing the two data bits when the use frequency is higher than a threshold corresponding to the high use level.

7. The electronic system of claim 6, wherein selection of the series of two two bit outputs representing the two data bits results in a tradeoff of decreased bit density for increased lifecycle.

8. The electronic system of claim 1, wherein each of the plurality of multi-bit memory cells is operable to hold at least three bits, and wherein the data set includes at least three data bits, and wherein the encoding circuit is operable to encode the three data bits as the encoded output to the plurality of multi-bit memory cells, and wherein the encoded output is selected from a group consisting of: a single three bit output representing the three data bits, and a series of three three bit outputs representing the three data bits.

9. The electronics system of claim 1, wherein determining the use frequency of a data set includes determining the frequency of writes of the data set to the memory bank.

10. The electronics system of claim 9, wherein determining the use frequency of a data set further includes determining the frequency of reads of the data set from the memory bank.

11. The electronics system of claim 1, wherein the plurality of multi-bit memory cells is a plurality of multi-bit flash memory cells.

12. The electronics system of claim 1, wherein the plurality of multi-bit memory cells is part of a flash memory system communicably coupled to a processor.

13. The electronics system of claim 12, wherein the processor is further communicably coupled to:
    an I/O device, and
    a random access memory.

14. A method for varying the lifecycle of a memory cell based upon use frequency, the method comprising:
    providing a memory device, wherein the memory device includes a plurality of multi-bit memory cells, and wherein each of the plurality of multi-bit memory cells is operable to hold at least two bits;
    receiving a data set, wherein the data set includes at least two data bits;
    determining a use frequency of the data set;
    selectably encoding the two data bits as two two bit outputs when the use frequency indicates a high use level; and
    writing the two two bit outputs to two of the plurality of multi-bit memory cells when the use frequency indicates the high use level.

15. The method of claim 14, wherein the method further comprises:
    selectably encoding the two data bits as a single two bit output when the use frequency indicates a low use level; and
    writing the single two bit output to one of the plurality of multi-bit memory cells when the use frequency indicates the low use level.

16. The method of claim 14, wherein the selectably encoding is governed at least in part by comparing the use frequency with a threshold level, wherein the high use level is indicated when the use frequency exceeds the threshold level, and wherein the low use level is indicated when the use frequency is less than the threshold level.

17. The method of claim 14, wherein determining the use frequency of the data set includes determining the frequency of writes of the data set to the memory bank.

18. The method of claim 17, wherein determining the use frequency of the data set further includes determining the frequency of reads of the data set from the memory bank.

19. A memory circuit, the memory circuit comprising:
    a flash memory device, wherein the flash memory device includes a plurality of multi-bit memory cells, and wherein each of the plurality of multi-bit memory cells is operable to hold at least two bits;
    a memory access controller circuit, wherein the memory access controller circuit is operable to determine a use frequency of a data set maintained in the flash memory device; and
    an encoding circuit, wherein the encoding circuit is operable to encode the data set to yield an encoded output for writing to the flash memory device, wherein an encoding level is operable to control a number of bits to be stored in the multi-bit memory cells, and wherein the encoding level set is selected based at least in part on the use frequency of the data set.

20. The memory circuit of claim 19, wherein the memory circuit further comprises:
    a decoding circuit, wherein the decoding circuit is operable to reverse the encoding applied by the encoding circuit.

21. A system, the system comprising:
    a memory bank including a plurality of multi-bit memory cells, wherein each of the plurality of multi-bit memory cells is chargeable to distinguishable voltage levels, wherein each of the distinguishable voltage levels corresponds to at least two bits;
    a memory access controller circuit, wherein the memory access controller circuit is operable to determine a use frequency of a data set maintained in the memory bank; and
    an encoding circuit, wherein the encoding circuit is operable to encode the data set to yield an encoded output for writing to the memory bank, wherein an encoding level is operable to control a number of bits to be stored in the multi-bit memory cells, and wherein the encoding level is selected based at least in part on the use frequency of the data set.

22. The system of claim 21, wherein the encoding level is selected from a group consisting of: an encoding level using a first subset of the distinguishable voltage levels to yield a first number of bits per cell, and an encoding level using a second subset of the distinguishable voltage levels to yield a second number of bits per multi-bit memory cell; wherein the second number of bits per cell is more than the first number of bits per multi-bit memory cell.

23. The system of claim 21, wherein the electronic system further comprises:
    a decoding circuit, wherein the decoding circuit is operable to reverse the encoding applied by the encoding circuit.

24. The system of claim 21, wherein the data set includes at least two bits, wherein the encoding level includes at least a high use level and a low use level, and wherein the encoded output is selected from a group consisting of: a single two bit output representing the two data bits, and a series of two two bit outputs representing the two data bits.

25. The system of claim 24, wherein the encoded output is selected to be the single two bit output representing the two data bits when the use frequency is lower than a threshold corresponding to the low use level.

26. The system of claim 25, wherein selection of the single two bit output representing the two data bits results in a tradeoff of increased bit density for decreased lifecycle.

27. The system of claim 24, wherein the encoded output is selected to be the series of two two bit outputs representing the two data bits when the use frequency is higher than a threshold corresponding to the high use level.

28. The system of claim 27, wherein selection of the series of two two bit outputs representing the two data bits results in a tradeoff of decreased bit density for increased lifecycle.

29. The system of claim 21, wherein each of the plurality of multi-bit memory cells is operable to hold at least three bits, and wherein the data set includes at least three data bits, and wherein the encoding circuit is operable to encode the three data bits as the encoded output to the plurality of multi-bit memory cells, and wherein the encoded output is selected from a group consisting of: a single three bit output representing the three data bits, and a series of three three bit outputs representing the three data bits.

30. The system of claim 21, wherein determining the use frequency of a data set includes determining the frequency of writes of the data set to the memory bank.

31. The system of claim 30, wherein determining the use frequency of a data set further includes determining the frequency of reads of the data set from the memory bank.

\* \* \* \* \*